(12) United States Patent
Chen (10) Patent No.: US 7,317,601 B2
(45) Date of Patent: Jan. 8, 2008

(54) ELECTROSTATIC DISCHARGE PROTECTION DEVICE AND CIRCUIT THEREOF

(75) Inventor: Shiao-Shien Chen, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 552 days.

(21) Appl. No.: 10/710,695

(22) Filed: Jul. 29, 2004

(65) Prior Publication Data

US 2006/0023379 A1    Feb. 2, 2006

(51) Int. Cl.
 *H02H 9/00*    (2006.01)

(52) U.S. Cl. ........................................................ 361/56

(58) Field of Classification Search .................... 361/56
See application file for complete search history.

(56) References Cited

U.S. PATENT DOCUMENTS 3,706,041 A * 12/1972 Krausser ................... 455/194.1
6,803,633 B2 * 10/2004 Mergens et al. ............. 257/358

* cited by examiner

*Primary Examiner*—Stephen W. Jackson
(74) *Attorney, Agent, or Firm*—Jianq Chyun IP Office (57) ABSTRACT

An electrostatic discharge (ESD) protection circuit including a detection circuit for detecting the ESD current and a clamp circuit for bypassing an ESD current between a first pad and a second pad is provided. The detection circuit is connected between the first pad and the second pad, wherein the detection circuit comprises a diode and a variable resistor tuned by a diode, and an output terminal of the detection circuit is connected to the variable resistor. The clamp circuit is connected between the first pad and the second pad and connected to the output terminal of the detection circuit. When the ESD current from the first pad or the second pad is detected by the detection circuit, a trigger voltage is generated to trigger the clamp circuit to bypass the ESD current due to a resistance of the variable resistor is changed by the diode.

15 Claims, 5 Drawing Sheets

ELECTROSTATIC DISCHARGE PROTECTION DEVICE AND CIRCUIT THEREOF

BACKGROUND OF INVENTION

1. Field of the Invention

The present invention is related to an electrostatic discharge (ESD) protection device and circuit thereof. More particularly, the present invention relates to an ESD protection device and circuit thereof for bypassing an ESD current with higher shunting efficiency, faster turn-on efficiency and lower power consumption.

2. Description of Related Art

As the semiconductor technology advances, the integration of the semiconductor devices are enhanced by, for example, reducing the line width and increasing the stacked layers of the semiconductor device. For example, as the scale of the metal on oxide semiconductor (MOS) device is reduced, the gate oxides has to be thinner, the channel length has to be shorter, the source/drain junction has to be shallower, and the lightly doped drain (LDD) structure has to be adopted. However, as the area and the tolerance of the integrated circuits (IC) reduce, the damage caused by the electrostatic discharge (ESD) could become a serious problem.

Conventionally, the waveform of the electrostatic discharge (ESD) has the properties of short rise time (e.g., generally between 5 ns to 15 ns) and high pulse power (e.g., generally between 1000V to 3000V). Therefore, when the integrated circuit (IC) is damaged by the ESD, the IC might get punched through or burned out suddenly.

In general, in order to resolve the problems described above, an ESD protection circuit is generally disposed between the input and output pads of the IC to protect the IC from the ESD damage by shunting the electrostatic charges of the ESD source from the IC.

Figure 1:
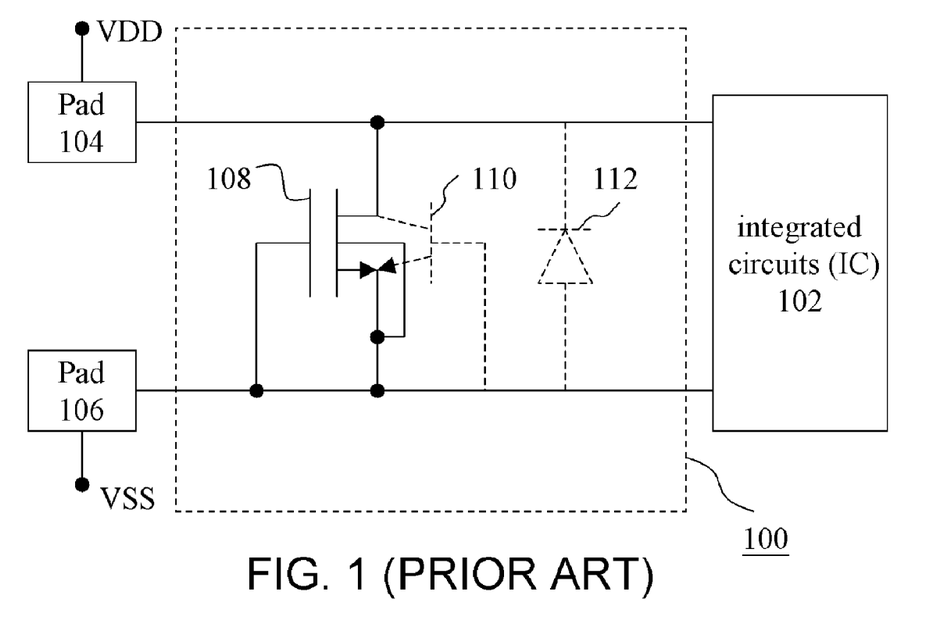
FIG. 1 is a circuit diagram schematically illustrating a conventional ESD protection circuit of an IC.

FIG. 1 is a circuit diagram schematically illustrating a conventional ESD protection circuit of an IC. Referring to FIG. 1, an ESD protection circuit 100 including a gate-ground NMOS (GGNMOS) 108 is connected between two pads 104 and 106 of the IC 102. The pad 104 is connected to a voltage VDD and the pad 106 is connected to a voltage VSS. The drain of the GGNMOS 108 is connected to the pad 104 and the source, the gate and the substrate of the GGNMOS 108 are connected to the pad 106. In general, when a positive ESD voltage is suddenly applied across the pads 104 and 106, a bipolar transistor 110 (illustrates as dotted lines 110 in FIG. 1) of the GGNMOS 108 is performed to bypass the ESD current. Alternatively, when a negative ESD voltage is applied suddenly across the pads 104 and 106, a parasitic diode (illustrated as dotted lines 112 in FIG. 1, which exists everywhere in the well/substrate junction of the integrated circuits (IC) 102 or in the ESD protection circuit 100) is forward biased and therefore is turned on to bypass the ESD current. Generally, the performance of the ESD protection circuit 100 including the GGNMOS 108 shown in FIG. 1 is not effective enough to protect the IC 102. In addition, the turn-on efficiency of the GGNMOS 108 is not fast enough.

Figure 2A:
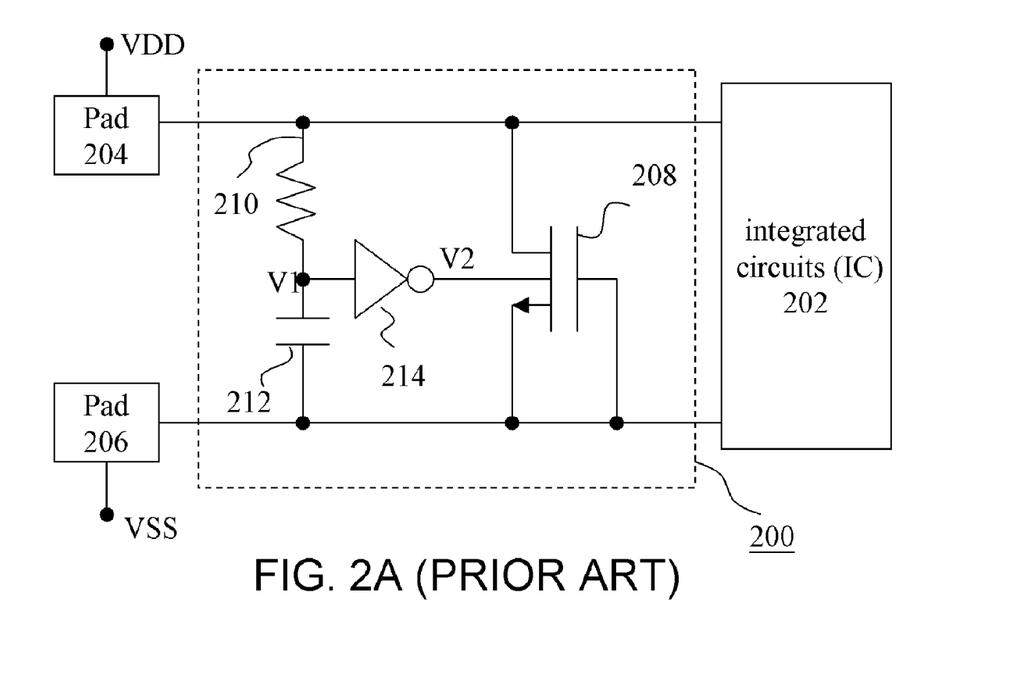
FIG. 2A and FIG. 2B are circuit diagrams schematically illustrating another conventional ESD protection circuit of an IC.
Figure 2B:
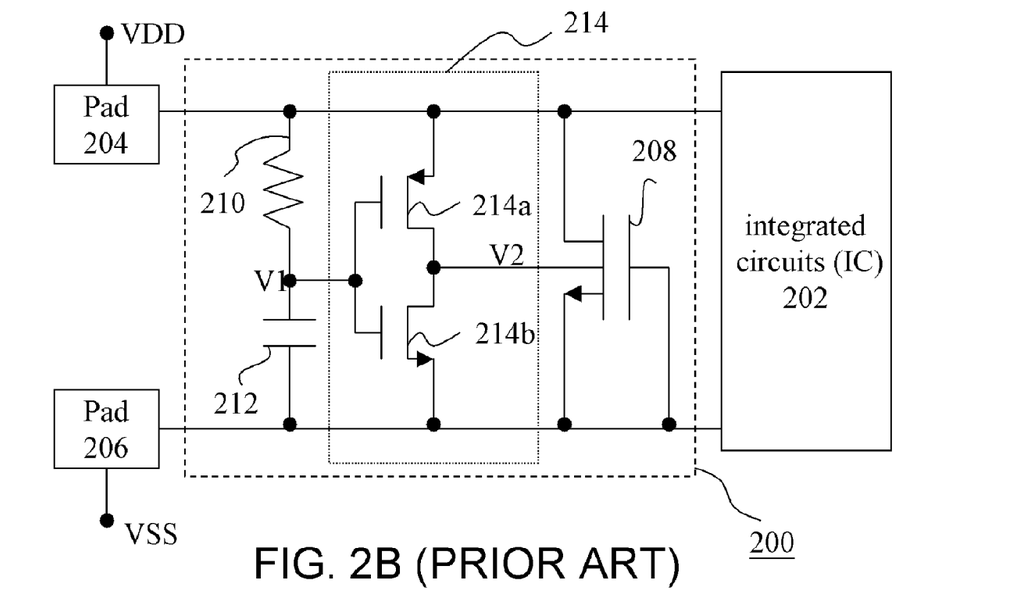

FIG. 2A and FIG. 2B are circuit diagrams schematically illustrating another conventional ESD protection circuit of an IC. Referring to FIG. 2A and FIG. 2B, an ESD protection circuit 200 is connected between two pads 204 and 206 of the IC 202. The pad 204 is connected to a voltage VDD and the pad 206 is connected to a voltage VSS. The ESD protection circuit 200 includes a gate-ground NMOS (GGN-MOS) 208, a resistor 210, a capacitor 212 and an inverter 214. The drain of the GGNMOS 208 is connected to the pad 204, the source and the gate of the GGNMOS 208 are connected to the pad 206, and the substrate of the GGNMOS 208 is connected to the output terminal of the inverter 214. The resistor 210 is connected between the pad 204 and the input of the inverter 214, and the capacitor 212 is connected between the pad 206 and the input terminal of the inverter 214. Referring to FIG. 2, the inverter 214 may be constructed by a PMOS 214a and an NMOS 214b. The gates of the PMOS 214a and an NMOS 214b are connected to and used as the input terminal of the inverter 214, and the drains of the PMOS 214a and an NMOS 214b are connected to and used as the output terminal of the inverter 214. The sources of the PMOS 214a and an NMOS 214b are connected to the pads 204 and 206 respectively.

Referring to FIG. 2A or FIG. 2B, the resistance-capacitance (RC) constant (i.e., the resistance R of the resistor 210 and the capacitance C of the capacitor 212, wherein the rise time of the RC constant is generally between 0.1 µs to 1 µs) is generally much larger than the rise time of the ESD voltage (generally between 5 ns to 15 ns). Therefore, when a positive ESD voltage is suddenly applied across the pads 204 and 206, the input voltage V1 at the input terminal of the inverter 214 is at low level compared to the voltage VDD due to the larger RC constant. Thus, the output voltage V2 at the output terminal of the inverter 214 is at high level since the voltage V1 is inverted by the inverter 214. Accordingly, the GGNMOS 208 will function as a bipolar transistor 110 (as illustrated by the dotted lines 110 in FIG. 1) and is triggered by the high level output voltage V2 to bypass the ESD current.

Alternatively, when a negative ESD voltage is suddenly applied across the pads 104 and 106, a parasitic diode (as illustrated by the dotted lines 112 in FIG. 1, which exists everywhere in the well/substrate junction of the integrated circuits (IC) 202 or in the ESD protection circuit 200) is forward biased and therefore is turned on to bypass the ESD current. However, as the semiconductor technology advances, the integration of the semiconductor device is enhanced and the tolerance of the semiconductor device to the ESD current is reduced, and the conventional ESD protection circuit design may not be effective in protecting the advanced semiconductor device with low tolerance to ESD current. Therefore, an ESD protection circuit with higher performance, higher shunting efficiency, faster turn-on efficiency and lower power consumption is highly desirable.

SUMMARY OF INVENTION

Accordingly, the present invention is directed to electrostatic discharge (ESD) protection device with higher performance, higher shunting efficiency, faster turn-on efficiency and lower power consumption capable of bypassing an ESD current.

In addition, the present invention is also directed to electrostatic discharge (ESD) protection circuit with higher performance, higher shunting efficiency, faster turn-on efficiency and lower power consumption capable of bypassing an ESD current.

In accordance with one embodiment of the present invention, an electrostatic discharge (ESD) protection device comprising, for example but not limited to, a detection device for detecting the ESD current and a clamp device for bypassing the ESD current, is provided. The detection device is connected between the first pad and the second pad, wherein the detection device comprises a diode and a variable resistor tuned by a diode, and an output terminal of the detection device is connected to the variable resistor. The clamp device is connected between the first pad and the second pad, and is connected to the output terminal of the detection device. When the ESD current from the first pad or the second pad is detected by the detection device, a trigger voltage is generated to trigger the clamp device to bypass the ESD current due to a resistance of the variable resistor is changed by the diode.

In one embodiment of the present invention, the first pad and the second pad comprise a VDD pad and a VSS pad, or the first pad and the second pad comprise a VSS pad and a VDD pad.

In one embodiment of the present invention, the detection device comprises a first N-type metal oxide semiconductor (NMOS) transistor comprising a drain connected to the first pad, a source connected to the output terminal of the detection device, a substrate connected to the second pad, and a gate connected to an output terminal of the diode, wherein an input terminal of the diode is connected to the second pad, and the variable resistor is connected between the output terminal of the detection device and the second pad.

In one embodiment of the present invention, the detection device further comprises a capacitor connected between the first pad and the gate of the first NMOS transistor, and a resistor connected between the second pad and the gate of the first NMOS transistor. In still another embodiment of the present invention, the clamp device comprises a second NMOS transistor comprising a drain connected to the first pad, a source connected to the second pad, a substrate connected to the output terminal of the detection device, and a gate connected to the substrate of the second NMOS transistor or the second pad.

In one embodiment of the present invention, the detection device comprises a bipolar PNP transistor comprising an emitter connected to source of the first NMOS transistor, a base connected to the second pad, and a collector connected to the output terminal of the detection device. In another embodiment of the present invention, the clamp device comprises a second NMOS transistor comprising a drain connected to the first pad, a source connected to the base of the bipolar PNP transistor, a substrate connected to the output terminal of the detection device, and a gate connected to the second pad. In still another embodiment of the present invention, the detection device comprises a capacitor connected between the first pad and the gate of the first NMOS transistor, and a resistor connected between the second pad and the gate of the first NMOS transistor.

In one embodiment of the present invention, the clamp device comprises a second NMOS transistor comprising a drain connected to the first pad, a source connected to the second pad, a substrate connected to the output terminal of the detection device, and a gate connected to the substrate of the second NMOS transistor or the second pad.

In accordance with one embodiment of the present invention, an electrostatic discharge (ESD) protection circuit for bypassing an ESD current between a first pad and a second pad is provided. The ESD protection circuit comprises, for example but not limited to, a P-type substrate, a diode, a N-type metal oxide semiconductor (NMOS) transistor, a first P+ region and a second P+ region. The diode comprises, for example but not limited to, a N-well region in the substrate and a N+ region in the N-well region. The NMOS transistor comprises, for example but not limited to, a drain region in the substrate and connected to the first pad, a source region in the substrate and connected to the second pad, a gate formed over a portion of the drain region, a portion of the source region and the substrate there-between. The first P+ region is formed in the substrate between the N-well region and the source region of the NMOS transistor, and the second P+ region is formed in the substrate at the other side of the N-well region. The gate region of the NMOS transistor is connected to the first P+ region or the second P+ region, and the second P+ region is connected to the second pad.

In one embodiment of the present invention, when the ESD current is detected from the first pad or the second pad, a trigger voltage is generated to trigger the NMOS transistor to bypass the ESD current due to a resistance of substrate around the N-well is changed by the diode.

In one embodiment of the present invention, the first pad and the second pad comprise a VDD pad and a VSS pad, or the first pad and the second pad comprise a VSS pad and a VDD pad.

In one embodiment of the present invention, the ESD protection circuit further comprises another NMOS transistor comprising a drain region connected to the first pad, a source region connected to the first P+ region, a substrate region connected to the second pad, and a gate region connected to the N+ region of the N-well.

In one embodiment of the present invention, the ESD protection circuit further comprises a capacitor connected between the first pad and the gate region of the another NMOS transistor, and a resistor connected between the second pad and the gate region of the another NMOS transistor.

In one embodiment of the present invention, the when the gate region of the NMOS transistor is connected to the second P+ region, the ESD protection circuit further comprises a bipolar PNP transistor comprising an emitter connected to the first P+ region, a base connected to the source region of the NMOS transistor, and a collector connected to a portion of the substrate under the first P+ region and the source region of the NMOS transistor. In another embodiment of the present invention, the ESD protection circuit further comprises a capacitor connected between the first pad and the gate region of another NMOS transistor, and a resistor connected between the second pad and the gate region of the other NMOS transistor.

Accordingly, in the ESD protection circuit of the present invention, since a variable transistor tuned by a diode is provided for the detection circuit to trigger the clamp circuit to bypass the ESD current, the turn-on efficiency and the shunting efficiency of the clamp circuit is enhanced. Therefore, the performance of the ESD protection circuit is also enhanced and the power consumption of the ESD protection circuit is reduced.

One or part or all of these and other features and advantages of the present invention will become readily apparent to those skilled in this art from the following description wherein there is shown and described a preferred embodiment of this invention, simply by way of illustration of one of the modes best suited to carry out the invention. As it will be realized, the invention is capable of different embodiments, and its several details are capable of modifications in various, obvious aspects all without departing from the invention. Accordingly, the drawings and descriptions will be regarded as illustrative in nature and not as restrictive.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 3A:
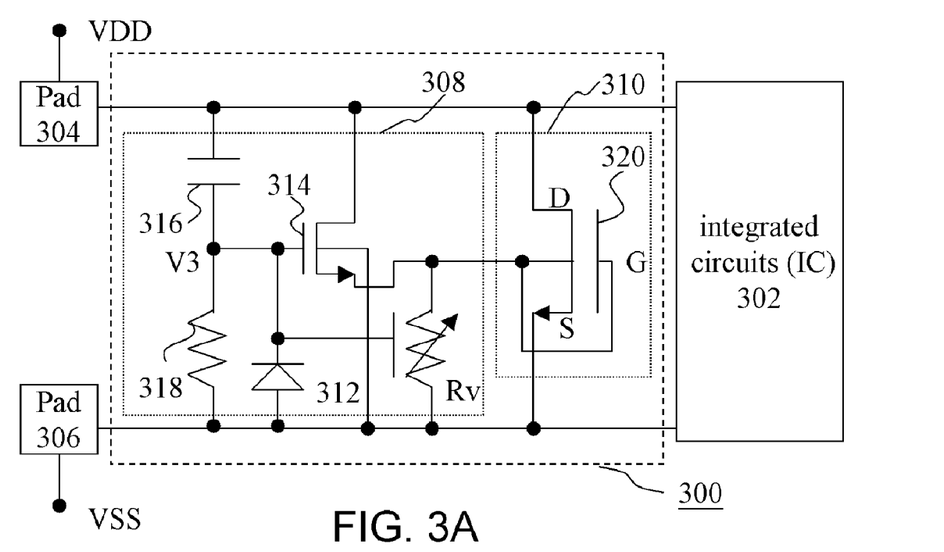
FIG. 3A is a circuit diagram of an ESD protection circuit according to one embodiment of the present invention.
Figure 3B:
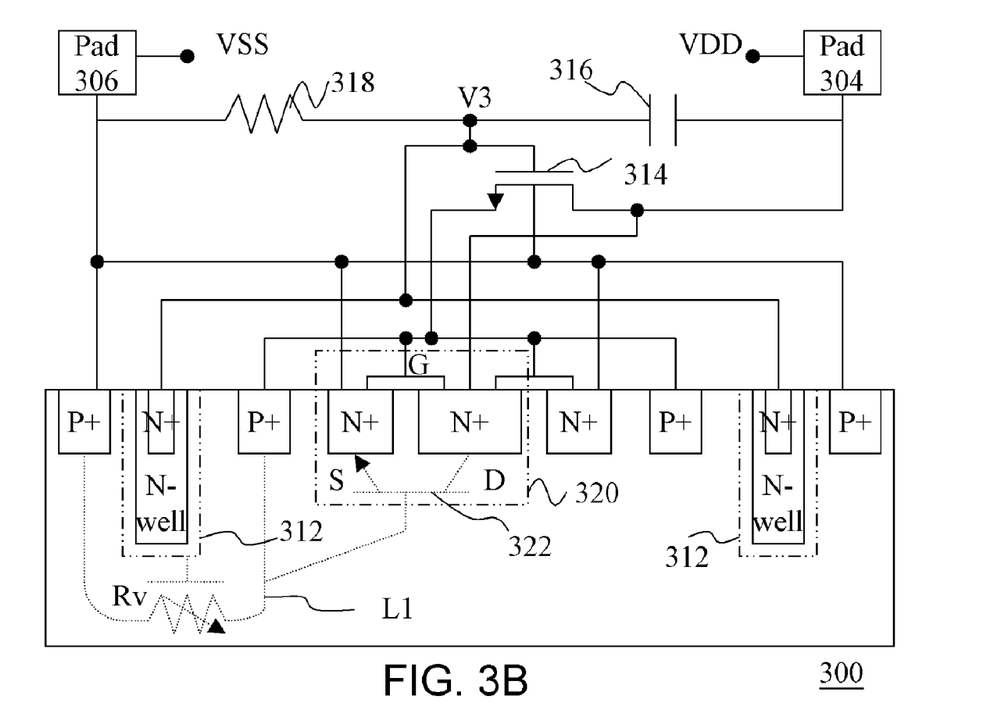
FIG. 3B is a schematic cross-sectional view of an ESD protection circuit according to one embodiment of the present invention.

FIG. 3A is a circuit diagram of an ESD protection circuit according to one embodiment of the present invention. FIG. 3B is a schematic cross-sectional view of an ESD protection circuit according to one embodiment of the present invention. Referring to FIG. 3A, an ESD protection circuit 300 is connected between two pads 304 and 306 of the IC 302. The pad 304 is connected to a voltage VDD and the pad 306 is connected to a voltage VSS. The ESD protection circuit 300 comprises, for example but not limited to, a detection circuit 308 and a clamp circuit 310. Both of the detection circuit 308 and the clamp circuit 310 are connected between the pads 304 and 306 respectively, and the clamp circuit 310 is connected to the detection circuit 308.

Referring to FIG. 3A, the detection circuit 308 comprises, for example but not limited to, a variable resistor Rv, a diode 312, a transistor 314, a capacitor 316 and a resistor 318. The clamp circuit 310 comprises, for example but not limited to, a transistor 320. The drain of the transistor 314 is connected to the pad 304, the substrate of the transistor 314 is connected to the pad 306, and the source of the transistor 314 is connected to the substrate of the transistor 320. The capacitor 316 is connected between the pad 304 and the gate of the transistor 314, and the resistor 318 is connected between the pad 306 and the gate of the transistor 314. The input terminal of the diode 312 is connected to the pad 306, and the output terminal of the diode 312 is connected to the gate of the transistor 314. The variable resistor Rv is connected between the source of the transistor 314 and the pad 306, and may be tuned by the diode 312. The drain D of the transistor 320 is connected to the pad 304, the source S of the transistor 320 is connected to the pad 306, and the gate G of the transistor 320 is connected to the source of the transistor 314.

FIG. 3B illustrates a cross-sectional view of a semiconductor device as an embodiment of the circuit shown in FIG. 3A. Referring to FIG. 3B, in one embodiment of the present invention, the substrate comprises, for example but not limited to, a P-type substrate, wherein the transistor 320 may be an NMOS transistor comprises a gate G, a N+ doped source S, a N+ doped drain D and the P-type substrate. The diode 312 may be constructed by, for example but not limited to, the P-type substrate and an N-well region having an N+ doped region. It is noted that, the variable resistor Rv may be constructed by, for example but not limited to, the substrate along the path L1 around the N-well region (as shown in FIG. 3B). In other words, the resistance of the variable resistor Rv is dependent on the length of the path L1. In one embodiment of the present invention, the transistor 314 comprises, for example but not limited to, an NMOS transistor. Hereinafter, the operation of the ESD protection circuit 300 will be described with reference to FIG. 3A and FIG. 3B.

Referring to FIG. 3A, the detection circuit 308 is provided for detecting the ESD source and the clamp circuit 310 is provided for bypassing the ESD current from damaging the IC 302, wherein the clamp circuit 310 is controlled and triggered by the detection circuit 308. In one embodiment of the present invention, the resistance-capacitance (RC) constant (i.e., the resistance R of the resistor 318 and the capacitance C of the capacitor 316) is much larger than the rise time of the ESD voltage. Therefore, when a positive ESD voltage is suddenly applied across the pads 304 and 306, the voltage VDD is much higher than the voltage VSS. In the meanwhile, the voltage V3 at the gate of the transistor 314 is close to the voltage VDD since the RC constant is much larger than the rise time of the ESD voltage. Therefore, the voltage V3 at the gate of the transistor 314 is high, and thus the transistor 314 is turned on. At this moment, the high voltage V3 is also applied at the output terminal of the diode 312, and thus the region of the N-well is enlarged. Therefore, the resistance of the variable resistor Rv is increased since the length of the path L1 is increased due to the change of the N-well. Accordingly, a parasitic bipolar transistor 322 of the transistor 320 (illustrated as the dotted lines 322 in FIG. 3B) is operated in a forward bias condition, and the ESD current is bypassed from the transistor 320 of the clamp circuit 310.

Alternatively, when a negative ESD voltage is suddenly across the pads 304 and 306, a parasitic diode existing everywhere in the well/substrate junction of the integrated circuits (IC) 302 or in the ESD protection circuit 300 is forward biased and therefore is turned on to bypass the ESD current.

Figure 4A:
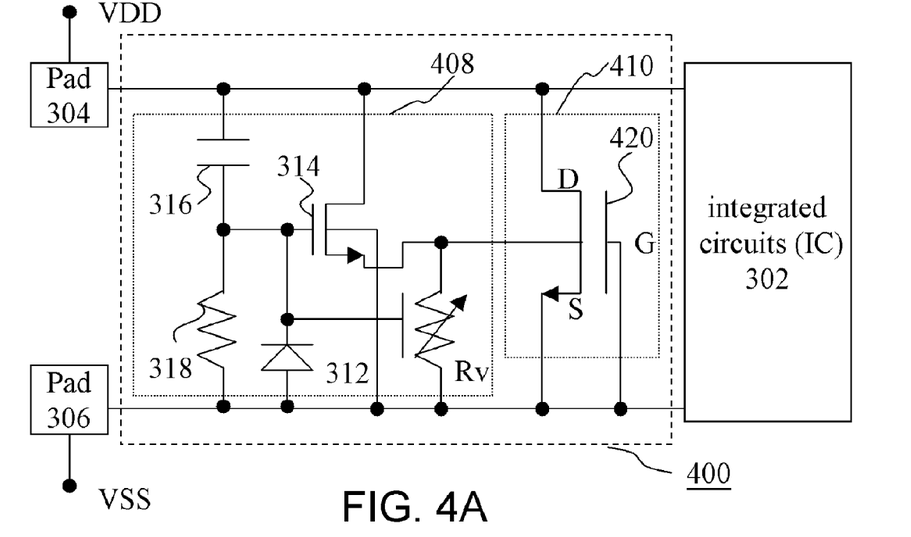
FIG. 4A is a circuit diagram of an ESD protection circuit according to one embodiment of the present invention.
Figure 4B:
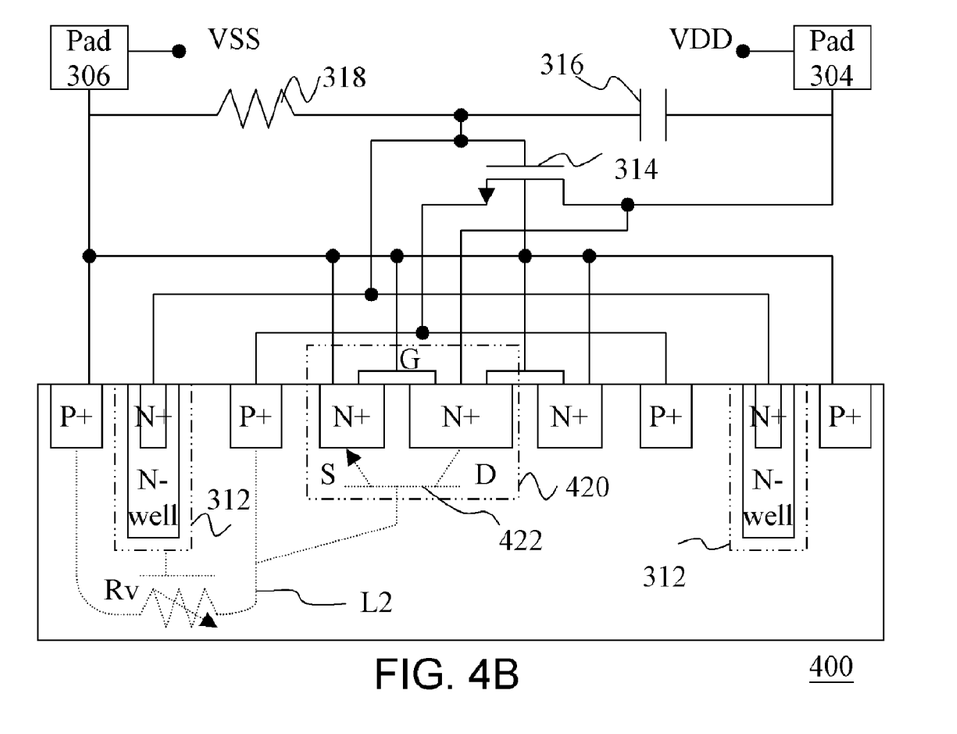
FIG. 4B is a schematic cross-sectional view of an ESD protection circuit according to one embodiment of the present invention.

FIG. 4A is a circuit diagram of an ESD protection circuit according to one embodiment of the present invention. FIG. 4B is a schematic cross-sectional view of an ESD protection circuit according to one embodiment of the present invention. Referring to FIG. 4A, the ESD protection circuit 400 comprises, for example but not limited to, a detection circuit 408 and a clamp circuit 410. The detection circuit 408 shown in FIG. 4A and FIG. 4B may be the same as the detection circuit 308 shown in FIG. 3A and FIG. 3B. It is noted that, the clamp circuit 410 is similar to the clamp circuit 310 except for the gate of the transistor 420 of the clamp circuit 410 is connected to the pad 306.

Referring to FIG. 4A and FIG. 4B, as described above, when the positive ESD voltage is suddenly applied across the pads 304 and 306, a parasitic bipolar transistor 422 of the transistor 420 (illustrated as the dotted lines 422 in FIG. 4B) is operated in a forward bias condition, and the ESD current is bypassed from the transistor 420 of the clamp circuit 410. Alternatively, when a negative ESD voltage is suddenly across the pads 304 and 306, a parasitic diode existing in the integrated circuits (IC) 302 or in the ESD protection circuit 400 is forward biased, and therefore is turned on to bypass the ESD current.

Figure 5A:
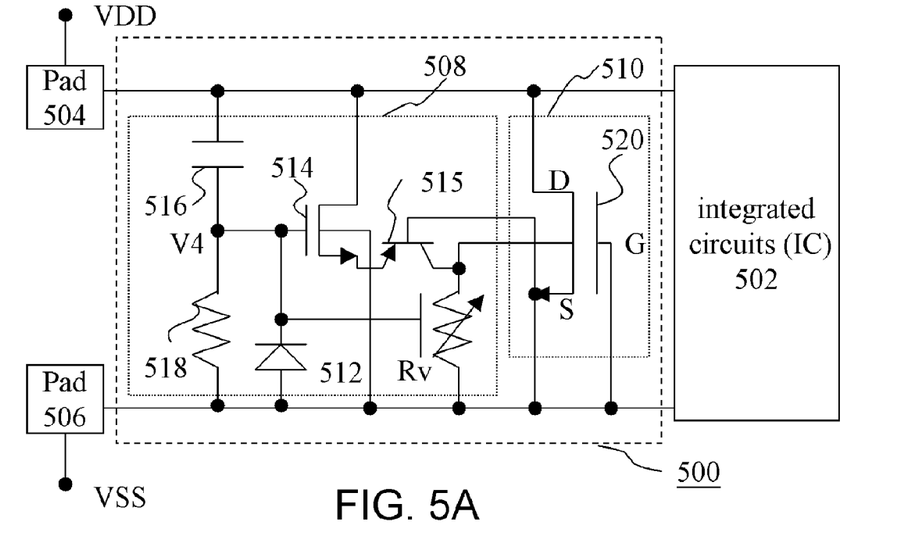
FIG. 5A is a circuit diagram of an ESD protection circuit according to one embodiment of the present invention.
Figure 5B:
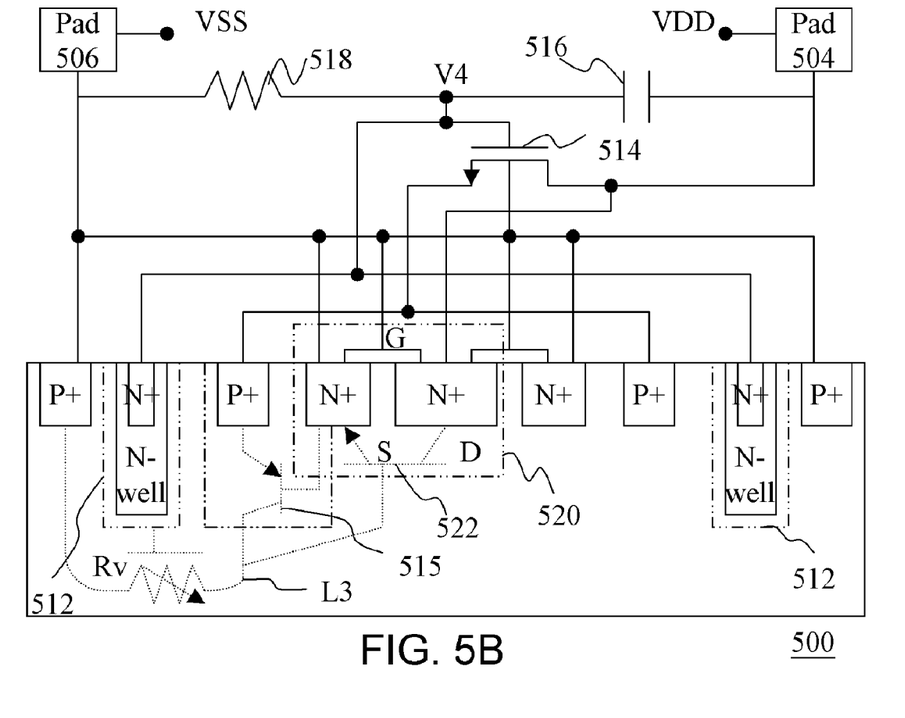
FIG. 5B is a schematic cross-sectional view of an ESD protection circuit according to one embodiment of the present invention.

FIG. 5A is a circuit diagram of an ESD protection circuit according to one embodiment of the present invention. FIG. 5B is a schematic cross-sectional view of an ESD protection circuit according to one embodiment of the present invention. Referring to FIG. 5A, an ESD protection circuit 500 is connected between two pads 504 and 506 of the IC 502. The pad 504 is connected to a voltage VDD and the pad 506 is connected to a voltage VSS. The ESD protection circuit 500 comprises, for example but not limited to, a detection circuit 508 and a clamp circuit 510. Both of the detection circuit 508 and the clamp circuit 510 are connected between the pads 504 and 506 respectively, and the clamp circuit 510 is connected to the detection circuit 508.

Referring to FIG. 5A, the detection circuit 508 comprises, for example but not limited to, a variable resistor Rv, a diode 512, a transistor 514, a PNP transistor 515, a capacitor 516 and a resistor 518. The clamp circuit 510 comprises, for example but not limited to, a transistor 520. The drain of the transistor 514 is connected to the pad 504, the substrate of the transistor 514 is connected to the pad 506, and the source of the transistor 514 is connected to the emitter of the PNP transistor 515. The capacitor 516 is connected between the pad 504 and the gate of the transistor 514, and the resistor 518 is connected between the pad 506 and the gate of the transistor 514. The input terminal of the diode 512 is connected to the pad 506, and the output terminal of the diode 512 is connected to the gate of the transistor 514. The variable resistor Rv is connected between the collector of the PNP transistor 515 and the pad 306, and may be tuned by the diode 512. The drain D of the transistor 520 is connected to the pad 504, the source S of the transistor 520 is connected to the pad 306 and the base of the PNP transistor 515, and the gate G of the transistor 520 is connected to the pad 506.

FIG. 5B illustrates a cross-sectional view of a semiconductor device as an embodiment of the circuit shown in FIG. 5A. Referring to FIG. 5B, in one embodiment of the present invention, the substrate comprises, for example but not limited to, a P-type substrate, wherein the transistor 520 may be an NMOS transistor comprises a gate G, a N+ doped source S, a N+ doped drain D and the P-type substrate. The diode 512 may be constructed by, for example but not limited to, the P-type substrate and an N-well region having an N+ doped region. It is noted that, the variable resistor Rv may be constructed by, for example but not limited to, the substrate along the path L3 around the N-well region (as shown in FIG. 5B). In other words, the resistance of the variable resistor Rv is dependent on the length of the path L3. In addition, the PNP transistor 515 may be constructed by, for example but not limited to, a parasitic bipolar PNP transistor comprising a P-type substrate, a N+ doped region and a P+ doped region as shown in FIG. 5B. In one embodiment of the present invention, the transistor 514 comprises, for example but not limited to, an NMOS transistor. Hereinafter, the operation of the ESD protection circuit 500 will be described with reference to FIG. 5A and FIG. 5B.

In one embodiment of the present invention, the resistance-capacitance (RC) constant (i.e., the resistance R of the resistor 518 and the capacitance C of the capacitor 516) is much larger than the rise time of the ESD voltage. Therefore, when a positive ESD voltage is suddenly applied across the pads 504 and 506, the voltage VDD is much higher than the voltage VSS. In the meanwhile, the voltage V4 at the gate of the transistor 514 is close to the voltage VDD since the RC constant is much larger than the rise time of the ESD voltage. Therefore, the voltage V4 at the gate of the transistor 514 is high, and thus the transistor 514 is turned on. At this moment, the PNP transistor 515 is triggered and the leakage current of the substrate is generated. In addition, the high voltage V4 is also applied at the output terminal of the diode 512, and thus the region of the N-well is enlarged. Therefore, the resistance of the variable resistor Rv is increased since the length of the path L3 is increased due to the change of the N-well. Accordingly, a parasitic bipolar transistor 522 of the transistor 520 (illustrated as the dotted lines 522 in FIG. 5B) is operated in a forward bias condition, and the ESD current is bypassed from the transistor 520 of the clamp circuit 510.

Alternatively, when a negative ESD voltage is suddenly across the pads 504 and 506, a parasitic diode existing everywhere in the well/substrate junction of the integrated circuits (IC) 502 or in the ESD protection circuit 500 is forward biased and therefore is turned on to bypass the ESD current.

Accordingly, in the ESD protection circuit of the present invention, since a variable transistor tuned by a diode is provided to the detection circuit to trigger the clamp circuit and thereby bypass the ESD current, the turn-on efficiency and the shunting efficiency of the clamp circuit is enhanced. Therefore, the performance of the ESD protection circuit is also enhanced and the power consumption of the ESD protection circuit is reduced.

The foregoing description of the preferred embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

The invention claimed is:

1. An electrostatic discharge (ESD) protection device for bypassing an ESD current between a first pad and a second pad, comprising:

a detection device, for detecting the ESD current, the detection device being connected between the first pad and the second pad, wherein the detection device comprises a diode and a variable resistor tuned by a diode, and an output terminal of the detection device is connected to the variable resistor; and a clamp device, for bypassing the ESD current, the clamp device is connected between the first pad and the second pad and connected to the output terminal of the detection device;

wherein when the ESD current from the first pad or the second pad is detected by the detection device, a trigger voltage is generated to trigger the clamp device to bypass the ESD current due to a resistance of the variable resistor is changed by the diode.

2. The ESD protection device of claim 1, wherein the first pad and the second pad comprise a VDD pad and a VSS pad, or the first pad and the second pad comprise a VSS pad and a VDD pad.

3. The ESD protection device of claim 1, wherein the detection device comprises a first N-type metal oxide semiconductor (NMOS) transistor comprising a drain connected to the first pad, a source connected to the output terminal of the detection device, a substrate connected to the second pad, and a gate connected to an output terminal of the diode, wherein an input terminal of the diode is connected to the second pad, and the variable resistor is connected between the output terminal of the detection device and the second pad.

4. The ESD protection device of claim 3, wherein the detection device comprises a capacitor connected between the first pad and the gate of the first NMOS transistor, and a resistor connected between the second pad and the gate of the first NMOS transistor.

5. The ESD protection device of claim 3, wherein the clamp device comprises a second NMOS transistor comprising a drain connected to the first pad, a source connected to the second pad, a substrate connected to the output terminal of the detection device, and a gate connected to the substrate of the second NMOS transistor or the second pad.

6. The ESD protection device of claim 3, wherein the detection device comprises a bipolar PNP transistor comprising an emitter connected to source of the first NMOS transistor, a base connected to the second pad, and a collector connected to the output terminal of the detection device.

7. The ESD protection device of claim 6, wherein the clamp device comprises a second NMOS transistor comprising a drain connected to the first pad, a source connected to the base of the bipolar PNP transistor, a substrate connected to the output terminal of the detection device and a gate connected to the second pad.

8. The ESD protection device of claim 6, wherein the detection device comprises a capacitor connected between the first pad and the gate of the first NMOS transistor, and a resistor connected between the second pad and the gate of the first NMOS transistor.

9. The ESD protection device of claim 1, wherein the clamp device comprises a second NMOS transistor comprising a drain connected to the first pad, a source connected to the second pad, a substrate connected to the output terminal of the detection device, and a gate connected to the substrate of the second NMOS transistor or the second pad.

10. An electrostatic discharge (ESD) protection circuit for bypassing an ESD current between a first pad and a second pad, comprising:

a P-type substrate;

a diode, comprising a N-well region in the substrate and a N+ region in the N-well region;

a N-type metal oxide semiconductor (NMOS) transistor, comprising a drain region in the substrate and connected to the first pad, a source region in the substrate and connected to the second pad, and a gate formed over a portion of the drain region, a portion of the source region and the substrate there-between; and a first P+ region, formed in the substrate between the N-well region and the source region of the NMOS transistor, and a second P+ region formed in the substrate at the other side of the N-well region, wherein the gate region of the NMOS transistor is connected to the first P+ region or the second P+ region and the second P+ region is connected to the second pad;

wherein when the ESD current from the first pad or the second pad is detected, a trigger voltage is generated to trigger the NMOS transistor to bypass the ESD current due to a resistance of substrate around the N-well is changed by the diode.

11. The ESD protection circuit of claim 10, wherein the first pad and the second pad comprise a VDD pad and a VSS pad, or the first pad and the second pad comprise a VSS pad and a VDD pad.

12. The ESD protection circuit of claim 10, further comprising:

another NMOS transistor comprising a drain region connected to the first pad, a source region connected to the first P+ region, a substrate region connected to the second pad and a gate region connected to the N+ region of the N-well.

13. The ESD protection circuit of claim 12, further comprising:

a capacitor, connected between the first pad and the gate region of the another NMOS transistor, and a resistor connected between the second pad and the gate region of the another NMOS transistor.

14. The ESD protection circuit of claim 12, wherein when the gate region of the NMOS transistor is connected to the second P+ region, further comprising:

a bipolar PNP transistor, comprising an emitter connected to the first P+ region, a base connected to the source region of the NMOS transistor, and a collector connected to a portion of the substrate under the first P+ region and the source region of the NMOS transistor.

15. The ESD protection circuit of claim 14, further comprising:

a capacitor, connected between the first pad and the gate region of the another NMOS transistor, and a resistor connected between the second pad and the gate region of the another NMOS transistor.

* * * * *